US010242843B2

(12) United States Patent
Guittienne

(10) Patent No.: US 10,242,843 B2
(45) Date of Patent: Mar. 26, 2019

(54) APPARATUS FOR LARGE AREA PLASMA PROCESSING

(75) Inventor: Philippe Guittienne, Belmont-sur-Lausanne (CH)

(73) Assignee: HELYSSEN Sàrl, Belmont-sur-Lausanne (CH)

(*) Notice: Subject to any disclaimer, the term of this patent is extended or adjusted under 35 U.S.C. 154(b) by 1505 days.

(21) Appl. No.: 13/148,536

(22) PCT Filed: Feb. 10, 2009

(86) PCT No.: PCT/IB2009/050549
§ 371 (c)(1),
(2), (4) Date: Aug. 9, 2011

(87) PCT Pub. No.: WO2010/092433
PCT Pub. Date: Aug. 19, 2010

(65) Prior Publication Data
US 2011/0308734 A1 Dec. 22, 2011

(51) Int. Cl.
*H01J 37/32* (2006.01)
(52) U.S. Cl.
CPC ......... *H01J 37/321* (2013.01); *H01J 37/3211* (2013.01); *H01J 37/3222* (2013.01); *H01J 37/32256* (2013.01); *H01J 37/32284* (2013.01)
(58) Field of Classification Search
CPC ............... H01J 37/321; H01J 37/32165; H01J 37/3222; H01J 37/32211; H01J 37/32256; H01J 37/32284
See application file for complete search history.

(56) References Cited

U.S. PATENT DOCUMENTS

| 5,589,737 A | * | 12/1996 | Barnes | H01J 37/321 219/121.43 |
| 5,685,942 A | * | 11/1997 | Ishii | H01J 37/32082 156/345.48 |
| 5,800,620 A | | 9/1998 | Rudder | |
| 6,181,069 B1 | * | 1/2001 | Tonotani et al. | 315/111.51 |
| 6,209,480 B1 | * | 4/2001 | Moslehi | H01J 37/321 118/723 I |
| 6,331,754 B1 | * | 12/2001 | Satoyoshi | H01J 37/3244 315/111.51 |
| 6,363,881 B2 | | 4/2002 | Murata | |
| 6,522,302 B1 | * | 2/2003 | Iwasaki | H01Q 9/16 343/725 |

(Continued)

FOREIGN PATENT DOCUMENTS

EP 0949352 B1 10/1999
EP 1079671 A2 2/2001
(Continued)

Primary Examiner — Charlee J C Bennett
(74) Attorney, Agent, or Firm — William H. Eilberg

(57) ABSTRACT

An apparatus for large area plasma processing according to the invention comprises at least one plane antenna (A) having a plurality of interconnected elementary resonant meshes (M1, M2, M3), each mesh (M1, M2, M3) comprising at least two conductive legs (1, 2) and at least two capacitors (5, 6). A radiofrequency generator excites said antenna (A) to at least one of its resonant frequencies. A process chamber is in proximity of said antenna (A). Said antenna (A) produces an electromagnetic field pattern with a very well defined spatial structure, which allows a great control on the excitation of the plasma.

12 Claims, 8 Drawing Sheets

(56) References Cited

U.S. PATENT DOCUMENTS

| | | | |
|---|---|---|---|
| 8,597,463 B2 * | 12/2013 | Sasaki | 156/345.48 |
| 2002/0007794 A1 * | 1/2002 | Byun | H01J 37/321 |
| | | | 118/723 I |
| 2005/0115676 A1 * | 6/2005 | Gondai | H01J 37/32082 |
| | | | 156/345.47 |
| 2007/0056515 A1 * | 3/2007 | Chevalier | H05H 1/46 |
| | | | 118/723 I |
| 2008/0138992 A1 * | 6/2008 | DiVergilio et al. | 438/710 |

FOREIGN PATENT DOCUMENTS

| | | |
|---|---|---|
| EP | 1480250 A1 | 11/2004 |
| JP | 10070107 | 3/1998 |
| WO | 9618208 A1 | 6/1996 |

* cited by examiner

APPARATUS FOR LARGE AREA PLASMA PROCESSING

TECHNICAL FIELD OF THE INVENTION

The present invention relates to an apparatus for large area plasma processing improving uniformity and plasma density.

SUMMARY OF THE INVENTION

Plasma processing is used very frequently for various applications such as surface coating, manufacturing flat panels or solar cells. Plasma processing comprises etching process, deposition process, surface modification, surface functionalization. For example, Plasma Enhanced Chemical Vapor Deposition (PECVD) is generally used to deposit thin films on a substrate, such as a transparent substrate for flat panel display, or a semiconductor wafer.

PECVD is generally accomplished by introducing a precursor gas or gas mixture into a vacuum chamber that contains a substrate. The precursor gas or gas mixture is typically directed downwardly through a distribution plate situated near the top of the chamber. The precursor gas or gas mixture in the chamber is energized into a plasma generated by a plasma source which can be of different types, depending on the process parameters. The main process parameter may possibly be the pressure range. The excited gas or gas mixture reacts to form a layer of material on the surface of the substrate that is positioned on a substrate holder, which has often a controlled temperature. Volatile by-products produced during the reactions are pumped from the chamber through an exhaust system.

Documents EP 0 949 352 B1 and U.S. Pat. No. 6,363,881 B2 disclose a planar ladder-shaped antenna for Plasma Enhanced Chemical Vapor Deposition. The ladder-shaped antenna has an upper side conductive bar, a lower side conductive bar, and several parallel conductive bars joining the upper and lower conductive bars. A power distributor with a plurality of electrical wires is used for uniformly distributing a high-frequency power to the ladder-shaped antenna, making it possible to obtain a better film thickness distribution.

But, even with a power distributor, it remains very difficult to obtain a large area plasma processing with a high processing rate and a uniform processing distribution.

There is a constant need in increasing the surface of the flat panels processed by PECVD. Today, pieces of about 1 $m^2$ are processed, and large substrates approaching and exceeding 5 $m^2$ are envisioned in the near future. Gas distribution plates, or diffuser plates, utilized to provide uniform process gas flow over flat panels during processing, are also relatively large in size, particularly as compared to the gas distribution plates utilized for 200 mm and 300 mm semiconductor wafers processing.

As the size of substrates continues to grow, film thickness control and film property control produced by conventional PECVD devices become more problematical.

STATEMENT OF THE INVENTION

Hence, an object of the present invention is to provide large, controlled process with simultaneously improved throughput.

Another object of the present invention is to provide preferably large uniform process.

To achieve the above and other objects, the invention proposes an apparatus for large area plasma processing, comprising:
  a. at least one plane antenna,
  b. at least one radiofrequency generator exciting said antenna,
  c. a gas injection system and diffuser,
  d. a process chamber in a proximity to said antenna,
  e. wherein said plane antenna comprises a plurality of interconnected elementary resonant meshes, each mesh comprising at least two conductive legs and at least two capacitors, so that said antenna has a plurality of resonant frequencies,
  f. and wherein said radiofrequency generator excites said antenna to at least one of its resonant frequencies.

Because the plane antenna has a plurality of interconnected elementary resonant meshes, and because the antenna is excited to at least one of its resonant frequencies, the amplitude distribution of currents in the elementary element meshes of the antenna is stable and can be very well defined over the whole surface of the antenna.

And the distribution of current amplitudes can be controlled by choosing which antenna resonant frequency is to be excited by the radiofrequency generator.

Resulting from the very well defined current amplitude distribution over the whole surface of the antenna, a very well defined distribution of plasma can be created by the antenna of the invention.

Considering that the plasma quickly diffuses from areas with high current intensities to areas with lower current intensities, a more uniform distribution of plasma can be created by the antenna of the invention.

Preferably, the conductive legs may be parallel to each other, so that each mesh generates an electromagnetic field with a more uniform distribution along the longitudinal axis of the mesh.

The antenna may advantageously comprise elementary resonant meshes having two parallel longer conductive legs whose ends are interconnected by transverse shorter connecting elements. Such a design of elementary resonant mesh allows effective interconnections of a plurality of meshes for constituting a large plane antenna.

According to a first embodiment, the transverse shorter connecting elements comprise opposing capacitors.

According to a second embodiment, the parallel longer conductive legs comprise opposing capacitors each connected in series between the lengths of a respective conductive leg.

Both embodiments may be combined, wherein first opposing capacitors are connected within the transverse shorter connecting elements and second opposing capacitors are connected within the conductive legs.

Those embodiments of elementary resonant meshes with parallel conductive legs may advantageously be interconnected by common legs for forming a ladder shaped resonant antenna. Such a design allows to constitute a very large antenna with well defined amplitude distribution of currents over the whole surface of the antenna.

The apparatus according to the invention may advantageously further comprise a conductive plate or shield parallel to the antenna, and means for adjusting the relative position of the plate, so that the resonant frequencies of the antenna can be adjusted.

By adjusting the relative position of the conductive plate with the antenna, the resonant frequencies of the antenna can be tuned in order to correspond to the generator excitation frequencies.

Furthermore, by adjusting the relative position of the conductive plate, the boundaries conditions of the plasma can be adjusted.

According to a preferred embodiment, the apparatus of the invention may further comprise means for generating a magnetic field in the vicinity of the antenna.

With such a magnetic field, plane polarized helicon-like waves can be excited in the plasma, so that the processing rate of the apparatus is improved.

According to a first embodiment of means for generating a magnetic field, the apparatus may comprise an array of permanent magnets.

According to a second embodiment of means for generating a magnetic field, the apparatus may further comprise means for injecting a DC current (direct current) in said antenna superposed to the radiofrequency current such that said DC current generates a magnetic field in the vicinity of the antenna.

For processing larger areas, the apparatus according to the invention may further comprise at least one supplementary antenna.

Preferably, the antenna is placed inside the process chamber.

In order to avoid RF (radiofrequency) reflections at the generator output, at least one matching network can be used.

According to a preferred embodiment, the radio frequency generator feeds the antenna with at least two phase shifted RF power signals at two different injection points, resulting in a translation with time of the current distribution in the legs of the antenna. In other words, this results in a travelling current distribution.

Accordingly, the plasma distribution is translated with time over the whole surface of the antenna.

This results in a more uniform processing distribution.

Furthermore, the travelling current distribution enhances strongly the helicon-like waves excitation.

BRIEF DESCRIPTION OF THE DRAWINGS

Other objects, features and advantages of the present invention will emerge from the following description of particular embodiments, given with reference to the appended drawings, in which.

DESCRIPTION OF THE PREFERRED EMBODIMENTS

According to the invention, a plane antenna with a plurality of elementary resonant meshes is provided as a source for generating large area plasmas.

Figure 1:
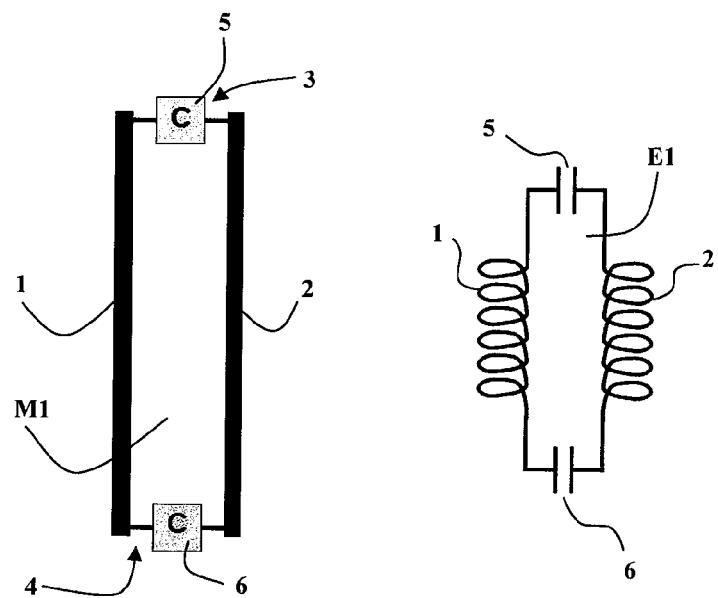
FIG. 1 shows a first embodiment of elementary mesh for the plane antenna, and the equivalent electric circuit thereof.
Figure 2:
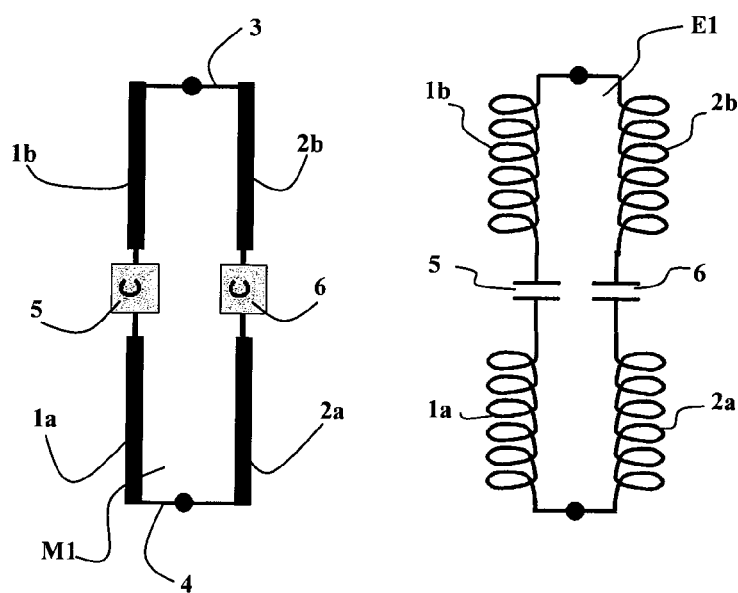
FIG. 2 shows a second embodiment of elementary mesh for the plane antenna, and the equivalent electric circuit thereof.
Figure 3:
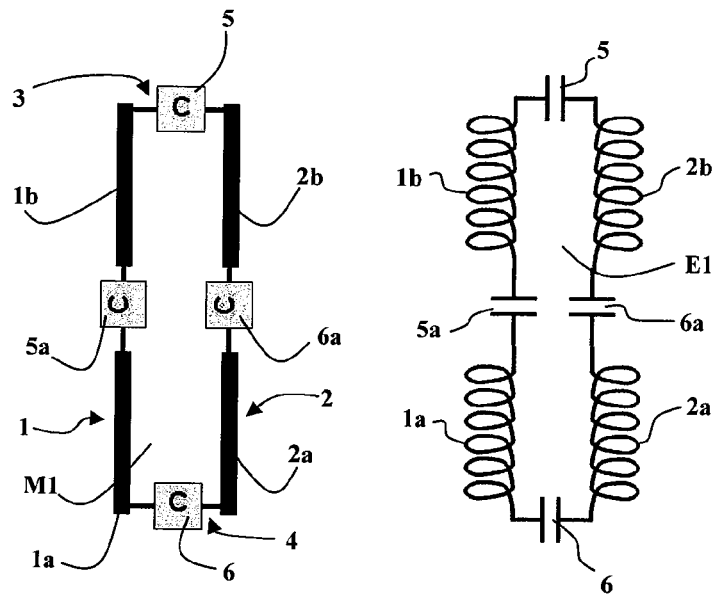
FIG. 3 shows a third embodiment of elementary mesh for the plane antenna, and the equivalent electric circuit thereof.

FIGS. 1, 2 and 3 show three embodiments for such an elementary mesh M1, and the corresponding equivalent electric circuit E1.

Each elementary mesh M1 has two parallel longer conductive legs 1 and 2 whose ends are interconnected by transverse shorter connecting elements 3 and 4.

The longer connecting legs 1 and 2 act essentially as inductive components. Each elementary mesh has at least two opposing capacitors 5 and 6.

In the high pass mesh of FIG. 1, the opposing capacitors 5 and 6 constitute said shorter connecting elements 3 and 4.

In the low pass mesh of FIG. 2, the opposing capacitors 5 and 6 are each connected in series between two lengths 1a, 1b or 2a, 2b of a respective conductive leg 1 or 2.

In the pass band mesh of FIG. 3, two first opposing capacitors 5 and 6 constitute said shorter connecting elements 3 and 4, and two second capacitors 5a and 6a are each connected in series between two lengths 1a, 1b or 2a, 2b of a respective conductive leg 1 or 2.

Each elementary mesh forms a resonant L-C loop as shown on the corresponding equivalent electric circuits E1.

Several elementary meshes are interconnected in order to form a plane antenna of the desired dimensions.

Figure 4:
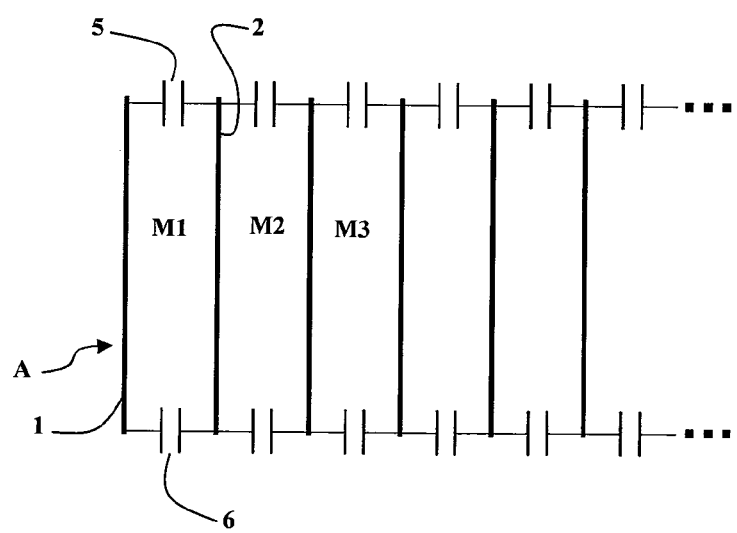
FIG. 4 illustrates a high pass antenna with a series of elementary meshes according to the first embodiment.

For instance, FIG. 4 shows a high pass antenna A made of a series of elementary high pass meshes M1, M2, M3 according to FIG. 1, interconnected to form a ladder-shaped resonant antenna.

Figure 5:
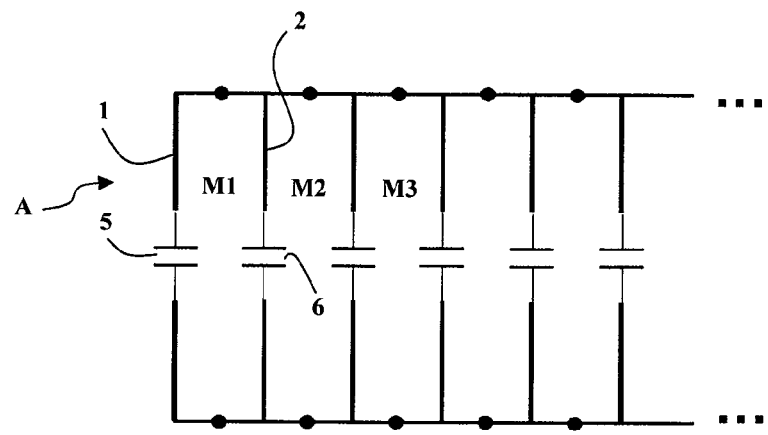
FIG. 5 shows a low pass antenna with a series of elementary meshes according to the second embodiment.

FIG. 5 shows a low pass antenna A made of a series of low pass meshes M1, M2, M3 according to FIG. 2, interconnected to form a ladder-shaped resonant antenna.

Figure 6:
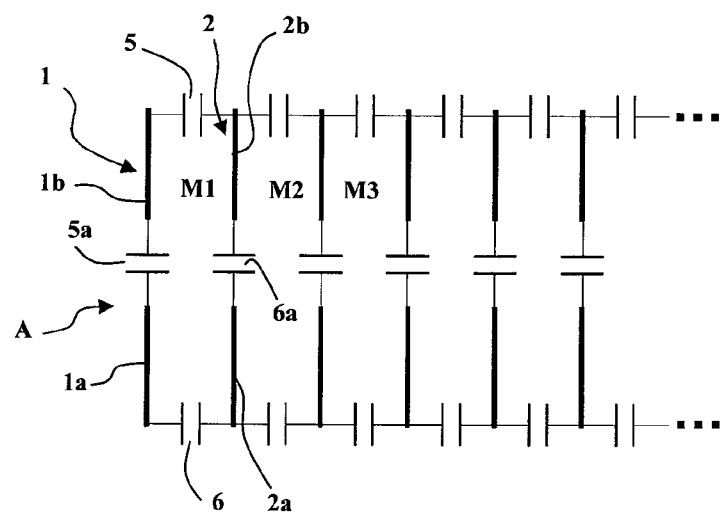
FIG. 6 shows a hybrid antenna with elementary meshes according to the third embodiment.

FIG. 6 shows a hybrid antenna A made of a series of elementary meshes M1, M2, M3 according to FIG. 3, interconnected to form a ladder-shaped resonant antenna.

In all three embodiments, adjacent meshes such as meshes M1 and M2 have a common conductive leg 2.

If N is the number of legs of the antenna A, said antenna A presents N−1 resonant frequencies. The values of these resonant frequencies depend on the geometry of the legs 1, 2 (length, diameter, distance between two adjacent legs . . . ) and on the values of the capacitors 5, 6.

Figure 7:
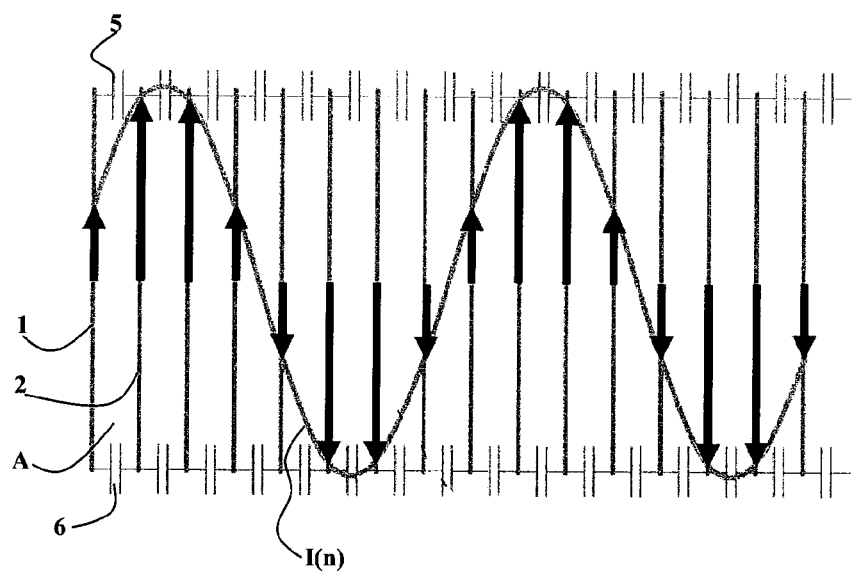
FIG. 7 shows the electric current intensity distribution in the antenna of FIG. 4 excited at one of its resonant frequencies.

If all capacitors 5, 6 have the same capacitance, and if all the legs 1, 2 are identical (same inductance), each resonant frequency corresponds to a sinusoidal current distribution I(n) in the antenna legs such as legs 1, 2, as shown for instance on FIG. 7:

$$I(n) = I_0 \sin\left(m\frac{\pi}{N}n\right)$$

where $I_0$ is an amplitude, n is a given leg number (n=[1:N]) and m is the resonant mode number (m=[1:N−1]). Note that this is a current amplitude distribution; from the temporal point of view the legs currents oscillate in phase. FIG. 7 shows the current amplitude distribution at the resonant frequency corresponding to resonant mode m=4.

Then, when excited at a resonant frequency, this antenna A produces an electromagnetic (EM) field pattern with a very well defined sinusoidal spatial structure. This allows a great control on the excitation of EM normal modes in the plasma (normal mode=eigenfunction). It is a specificity of the present invention that the antenna A will always be excited (or fed) at one, or several, of its resonant frequencies.

A large variety of EM waves can be excited in plasmas. Certain categories of waves can only exist if the plasma is magnetized, as for example the helicon waves in a cylindrical geometry. We are especially interested in this kind of waves because they lead, when damped, to a strong heating of the plasma, and then to high electrons densities.

Plane polarized "helicon-like" waves can be excited in a plasma slab, typically in the radiofrequency (RF) range (typ. 1-100 MHz). Hence in a preferred embodiment a static magnetic field is applied in the vicinity of the antenna A and the process chamber. It has to be noticed that this is not a strict requirement for a plasma to be generated by the antenna A of the present invention, as this antenna A can also operate without any static magnetic field, essentially by means of an inductive coupling with the plasma.

Figure 11:
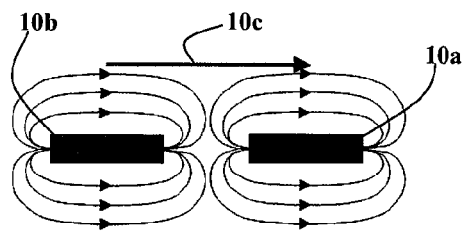
FIG. 11 is a side view showing two magnets for creation of a parallel mean magnetic field.
Figure 12:
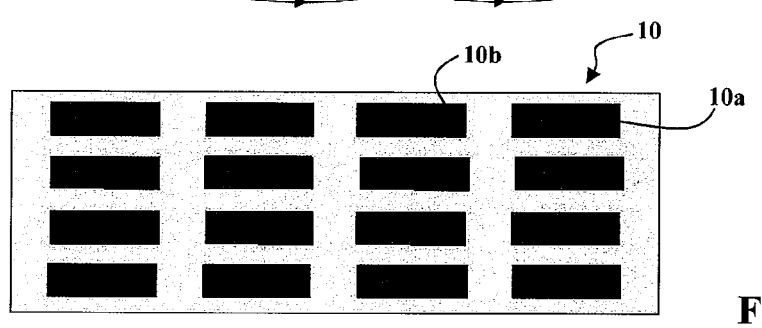
FIG. 12 is a plan view showing a magnet array for creating a plane magnetic field.

The static magnetic field can be generated by different means, such as permanent magnets as shown on FIGS. 11 and 12, or DC (direct current) coils.

On FIG. 11, two in line magnets 10a and 10b generate a side mean magnetic field 10c parallel to the magnets.

If the magnetic field is to be applied in a parallel direction with regards to the antenna A (or substrate) plane, an array 10 (top view on FIG. 12) of permanents magnets such as magnets 10a and 10b can be successfully used.

In the antenna A of the present invention we can also inject DC currents into the legs 1, 2, in addition to the RF excitation, in order to generate the desired static magnetic field in the vicinity of the antenna A.

Figure 9:
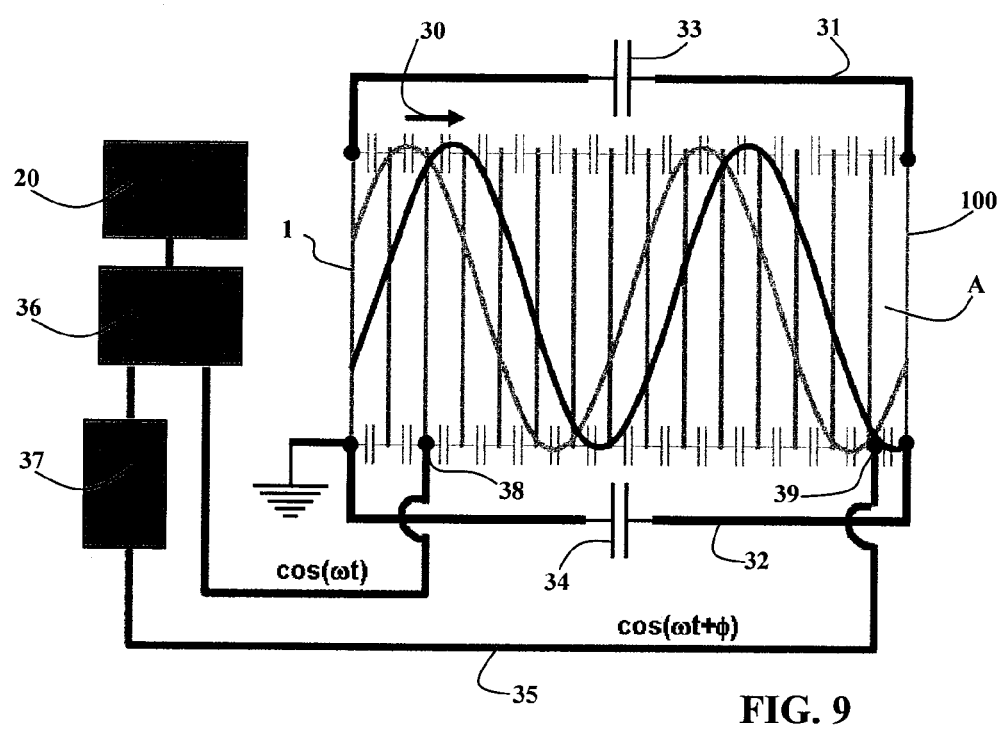
FIG. 9 shows an antenna of the invention fed with two phase shifted signals.
Figure 18:
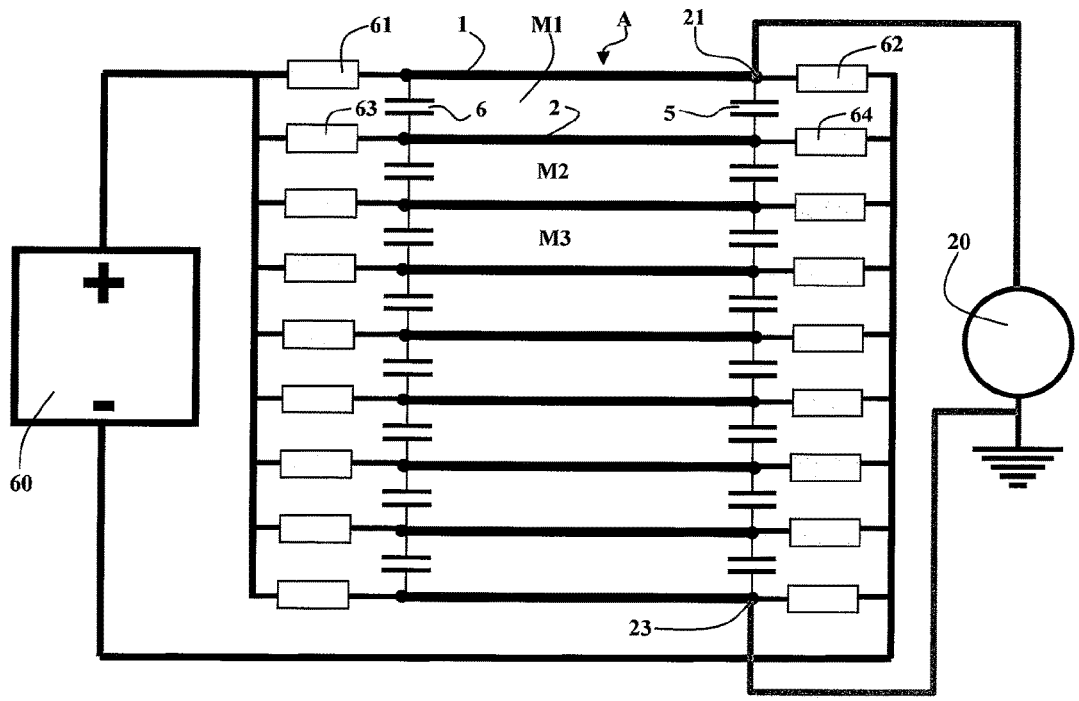
FIG. 18 shows a simple electric circuit for injecting direct current into the antenna.

FIG. 18 shows a simple electric circuit for injecting DC currents: the antenna A is similar to the high pass antenna of FIG. 4 or FIG. 9. The RF generator 20 feeds the antenna A with RF currents at two injection points 21 and 23. The DC generator 60 feeds the antenna A with DC currents at both ends of each conductive leg through respective choke coils: for instance, conductive leg 1 is fed through choke coils 61 and 62, and conductive leg 2 is fed through choke coils 63 and 64.

Figure 8:
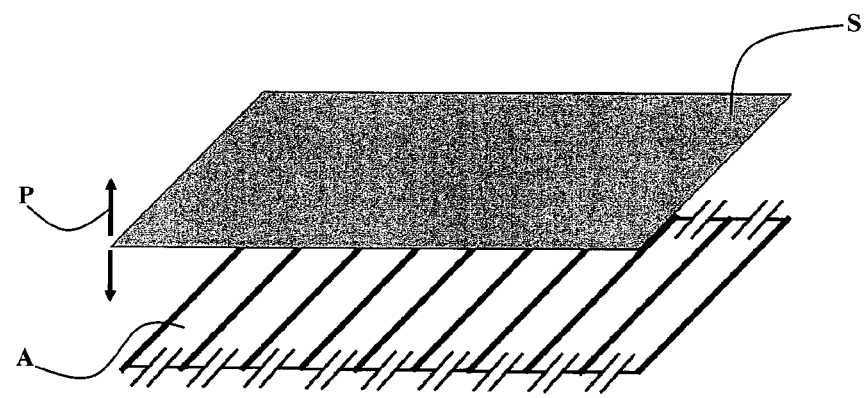
FIG. 8 shows an antenna associated with a conductive plate for adjusting the resonant frequencies and the boundaries conditions of the plasma.

The presence of the plasma slightly affects the resonant frequencies values, essentially because of inductive couplings. In order to compensate the frequency shifts, a conductive shield S (or plate) can be placed close to the antenna A (FIG. 8). By adjusting the relative position P of the shield S with the antenna A, the resonant frequencies can be tuned in order to correspond to the generators excitation frequencies. In addition the wave's energy deposition pattern in the plasma can be influenced by the position of such a shield S, and this last can be used as a means for adjusting the boundaries conditions of the plasma EM normal modes.

Figure 13:
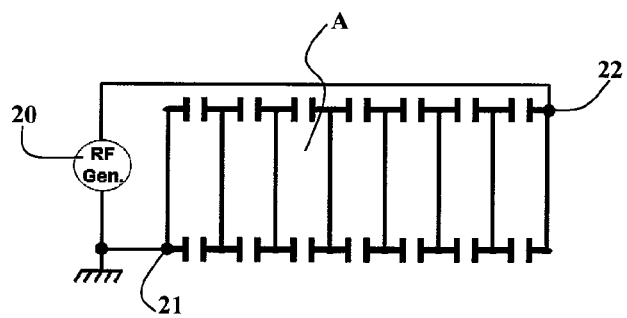
FIG. 13 shows a first embodiment for injecting currents into the antenna.
Figure 14:
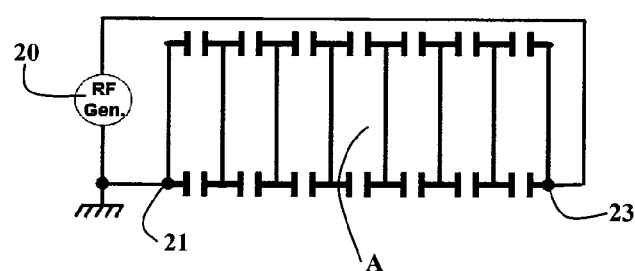
FIG. 14 shows a second embodiment for injecting currents into the antenna.

As long as the RF generator frequency corresponds to a desired resonant frequency of the antenna A, the RF energy might be injected anywhere on the antenna structure. As a matter of fact, if the antenna A is excited at a resonant frequency, the current distribution is not affected by the localization of the RF injection points. But the antenna impedance "seen" by the RF generator will depend on these injection points. From this point of view, it is generally better, although not necessary, to feed the antenna all across its structure, that is to say at end injection points as shown on FIG. 13 or 14. On FIG. 13, the generator 20 feeds the antenna A at two opposing end points 21 and 22. On FIG. 14, the generator 20 feeds the antenna A at two lower end injection points 21 and 23. Note that the configuration of FIG. 13 will allow pair values of m to be excited, while the configuration of FIG. 14 will allow odd values of m to be excited.

An extremely important point for large plasma processing is the uniformity of the process (deposition, etching, etc. . . . ) on the substrate. To do so the plasma must be as uniform as possible. In some cases, for example if the operating pressure in the reactor is high (typ. 1 mb), the plasma generated by a spatially fixed sinusoidal current distribution might present undesirable non uniformity. To make the plasma more uniform we can proceed to a quadratic (or bi-phased) feeding of the antenna A. An example of such a configuration is shown on FIG. 9.

On this figure it can be seen that the first leg 1 and the last leg 100 of the antenna A have been connected together at both ends by means of return lines 31 and 32 each one containing a compensation capacitor 33 or 34. The value of the compensation capacitors 33 and 34 is adjusted to compensate the inductance of the conductors 31 and 32 necessary to cover the distance between the two extreme legs 1 and 100.

The principle of the bi-phased feeding consists in exciting the antenna A with two phase shifted signals injected at two distant injection points such as injection points 38 and 39 on FIG. 9. These phase shifted signals can be obtained by combining several RF generators, or by splitting the signal issued from a single generator 20 with a power splitter 36 and a phase shifter 37 in the long conductor 35.

Figure 17:
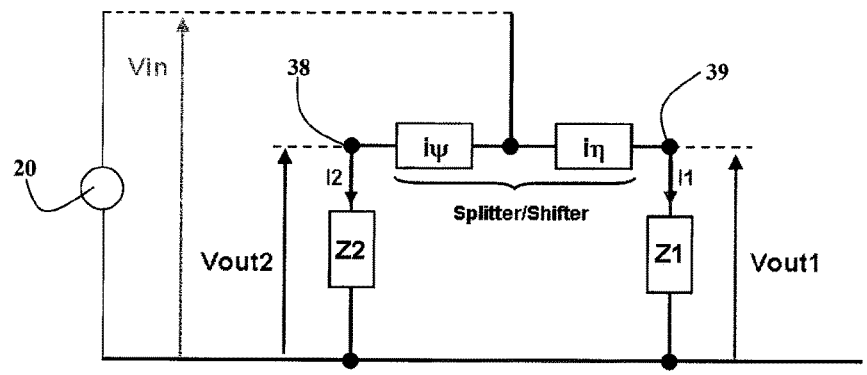
FIG. 17 shows a simple electric circuit for injecting two phase shifted currents into the antenna.

FIG. 17 shows a very simple configuration that allows the RF power of a single generator 20 to be split and which at the same time produces a temporal phase shift between two signals $V_{out}$ 1 and $V_{out}$ 2 issued from the power splitting.

Attention has to be paid to the fact that the simplicity of this system is only apparent, as the antenna input impedances $Z1=R1+iX1$ and $Z2=R2+iX2$ are themselves functions of the splitter/shifter components (i$\psi$ and i$\eta$). The ratio $R_{1,2}$ of the two input currents I1 and I2 amplitudes is given by the following relation:

$$R_{1,2} = \frac{\|I2\|}{\|I1\|} = \sqrt{\frac{R1^2 + (\psi + X1)^2}{R2^2 + (\eta + X2)^2}}$$

while the temporal phase shift $\phi_{1,2}$ between I1 and I2 is given by:

$$\phi_{1,2} = \arctan\left(\frac{R2(\psi + X1) - R1(\eta + X2)}{R1R2 + (\psi + X1)(\eta + X2)}\right)$$

$\psi$ and $\eta$ values are determined to obtain the desired $R_{1,2}$ and $\phi_{1,2}$.

The phase shift $\phi_{1,2}$ between the two signals can be arbitrarily chosen, but it is generally of $\pm 90°$. The amplitude ratio $R_{1,2}$ will generally be fixed to 1. With these conditions $\psi$ and $\eta$ take very simple expressions:

$$\begin{cases} \psi = -R2 - X1 \\ \eta = R1 - X2 \end{cases} \text{(for } +90° \text{ phase shift) and}$$

$$\begin{cases} \psi = R2 - X1 \\ \eta = -R1 - X2 \end{cases} \text{(for } -90° \text{ phase shift)}$$

The RF power injection points 38 and 39 for both signals depend on the resonant mode m that must be excited. When properly connected, this feeding configuration results in a translation 30 with time of the sinusoidal current distribution in the legs 1-100, as shown on FIG. 9. This traveling current distribution will result in a very uniform plasma heating.

Figure 10:
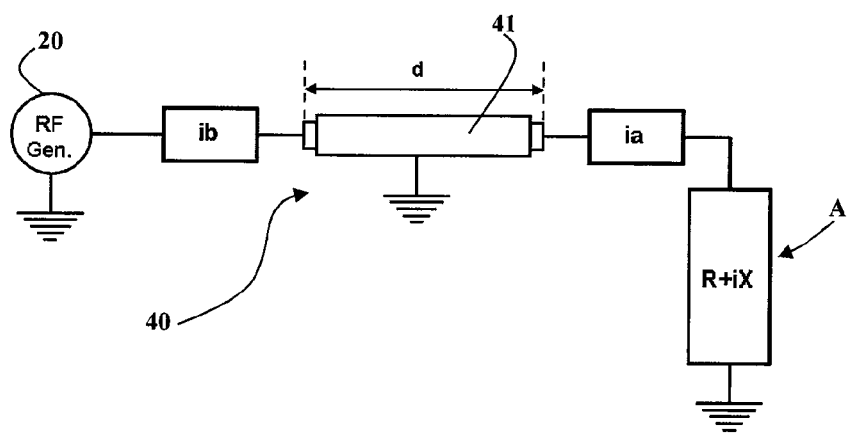
FIG. 10 shows the equivalent electric circuit of a matching network which may be used for feeding the antenna.

The antenna A being resonant, its impedance presents a strong real part R, which can be of several hundreds ohms, and a very small imaginary part iX, close to zero. In order to avoid RF reflections at the generator(s) output(s), impedance matching networks have to be used. Conventional matching networks might be used, but thanks to the antenna impedance properties (big real part and small imaginary part) a special serial matching system 40, shown on FIG. 10, can be achieved. That matching system 40 comprises adjustable imaginary impedances ib and ia, and a transmission line having a length d. In this system, the real impedance Rg "seen" by the RF generator 20 is given by:

$$Rg = \frac{2RZ_0^2}{R^2 + (a+X)^2 + Z_0^2 - (R^2 + (a+X)^2 - Z_0^2)\cos(2\beta d) - 2(a+X)Z_0 \sin(2\beta d)}$$

where $Z_0$ is the characteristic impedance of the transmission line 41 and $\beta$ is the wave number ($\beta = 2\pi/\lambda$ where $\lambda$ is the wave length) of the signal at frequency $\omega$ in the transmission line 41. Then with a suitable transmission line length d, Rg can be brought to the generator output real impedance by tuning the value of a alone. The imaginary part of the impedance "seen" by the RF generator 20 can then be brought to zero by tuning the value of b, and the matching is done.

Figure 15:
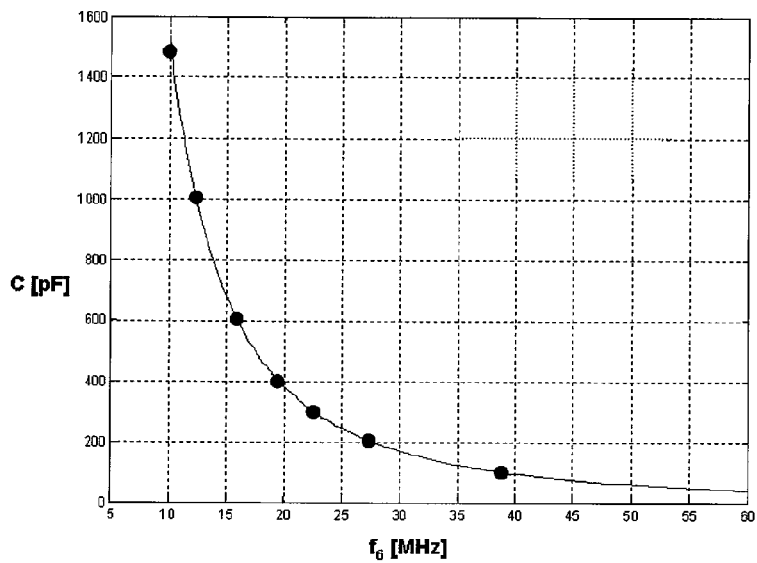
FIG. 15 shows an example of relationship between one of the resonant frequencies of an antenna and the values of the capacitors.

In the following paragraph we will give typical orders of magnitude for the main relevant parameters regarding plane antennas under operation. We take as an example a twenty two leg highpass antenna with a single power injection. We also take all the legs to be identical (0.5 m long, 6 mm in diameter), as well as the capacitors. Considering its dimensions, an individual leg represents an inductance of about 0.5 µH. We suppose that we wish to excite the m=6 resonant mode of the antenna. The frequency at which this m=6 resonance will occur depends naturally on the capacitance C of the antenna capacitors, as shown on FIG. 15. For example, if we take a 13.56 MHz RF generator 20 we will roughly need 800 pF capacitors to observe the m=6 resonance at this frequency.

Figure 16:
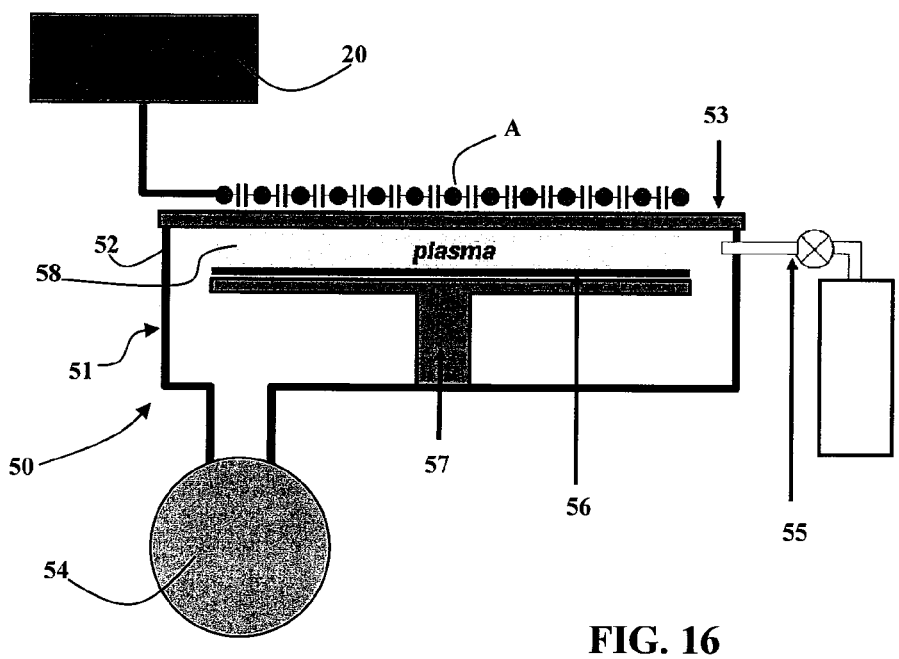
FIG. 16 shows a typical simple configuration for a large surface plasma processing reactor according to an embodiment of the invention.

FIG. 16 shows a typical simple configuration for a large surfaces plasma processing reactor 50. A process chamber 51 with a peripheral wall 52 and a reactor top plate 53 is connected to a pumping system 54 and to a discharge gas and process precursors (gas) injection system 55. An antenna A is placed in the vicinity of the reactor top plate 53, and is fed by the RF generator 20 with possible matching network. A substrate 56 to be processed is placed on a substrate holder 57 within the reactor chamber 51, substantially parallel to the antenna A. A plasma 58 is generated between the substrate 56 and the reactor top plate 53. The static magnetic field generator (FIG. 12) is not shown on this FIG. 16. If permanent magnets arrays 10 were to be used, they could be, for example, placed directly under the substrate 56, incorporated into the substrate holder 57. The conductive shield S allowing the fine adjustment of the resonant frequencies is not shown also.

The present invention is not limited to the embodiments that have been explicitly described, and encompasses variants and generalizations thereof within the scope of the following claims.

The invention claimed is:

1. An apparatus (50) for plasma processing comprising:
   a. at least one plane antenna (A),
   b. at least one radiofrequency generator (20) exciting said antenna (A),
   c. a gas injection system (55) and diffuser,
   d. a process chamber (51) in a proximity to said antenna (A),
   e. wherein said plane antenna (A) comprises a plurality of interconnected elementary resonant meshes (M1, M2, M3), each mesh (M1, M2, M3) comprising a resonant L-C loop having at least two conductive legs (1, 2) and at least two capacitors (5, 6), wherein the elementary resonant meshes are interconnected by common legs of the at least two conductive legs for forming a ladder shaped resonant circuit, the antenna being resonant, wherein the antenna has an impedance having a strong real part, of an order of several hundreds of ohms, and a very small imaginary part, close to zero, wherein said antenna (A) has a plurality of resonant frequencies, wherein said at least two conductive legs (1, 2) are straight and parallel to each other,
   f. and wherein said radiofrequency generator (20) excites said antenna (A) to at least one of its resonant frequencies.

2. An apparatus according to claim 1, wherein elementary resonant meshes (M1, M2, M3) have two parallel longer conductive legs (1, 2) whose ends are interconnected by transverse shorter connecting elements (3, 4).

3. An apparatus according to claim 2, wherein the transverse shorter connecting elements (3, 4) comprise opposing capacitors (5, 6).

4. An apparatus according to claim 2, wherein the parallel longer conductive legs (1, 2) comprise opposing capacitors (5, 6) each connected in series between the lengths (1a, 1b; 2a, 2b) of a respective conductive leg (1, 2).

5. An apparatus (50) according to claim 1, further comprising a conductive plate (S) parallel to the antenna (A), and means for adjusting the relative position (P) of the plate (5), so that the resonant frequencies of the antenna (A) can be adjusted.

6. An apparatus (50) according to claim 1, further comprising means (10) for generating a magnetic field in the vicinity of the antenna.

7. An apparatus according to claim 6 wherein the means (10) for generating a magnetic field comprises an array of permanent magnets (10*a*, 10*b*).

8. An apparatus (50) according to claim 6 further comprising means (60, 61, 62, 63, 64) for injecting a DC current in said antenna (A) superposed to the radiofrequency current, such that said DC current generates a magnetic field in the vicinity of the antenna (A).

9. An apparatus (50) according to claim 1, further comprising at least one supplementary antenna.

10. An apparatus (50) according to claim 1, wherein said antenna (A) is placed inside the process chamber (51).

11. An apparatus (50) according to claim 1, further comprising at least one matching network (40).

12. An apparatus (50) according to claim 1, wherein the radiofrequency generator (20) feeds the antenna (A) with at least two phase shifted RF power signals at two different injection points (38, 39), resulting in a translation (30) with time of the current distribution in the legs (1, 100) of the antenna (A).

\* \* \* \* \*